United States Patent [19]

Foulke

[11] 4,234,117
[45] Nov. 18, 1980

[54] VIBRATION-FREE TAILLESS WIRE BONDER

[76] Inventor: Richard F. Foulke, Indian Hill Rd., Carlisle, Mass. 01741

[21] Appl. No.: 909,824

[22] Filed: May 26, 1978

[51] Int. Cl.³ .......................................... H01L 21/60
[52] U.S. Cl. ..................................................... 228/4.5
[58] Field of Search ............... 228/1 R, 4.5; 219/85 F

[56] References Cited

U.S. PATENT DOCUMENTS

| | | | |
|---|---|---|---|
| 3,307,763 | 3/1967 | Rasimenoks et al. | 228/4.5 X |
| 3,328,875 | 7/1967 | Pennings | 228/4.5 X |
| 3,444,612 | 5/1969 | Pennings | 228/4.5 X |
| 3,626,590 | 12/1971 | Miller | 228/4.5 X |
| 3,643,321 | 2/1972 | Field et al. | 228/4.5 X |
| 3,660,631 | 5/1972 | Conley | 228/4.5 X |
| 3,863,827 | 2/1975 | Foulke et al. | 228/4.5 X |

Primary Examiner—Francis S. Husar
Assistant Examiner—Kenneth J. Ramsey

[57] ABSTRACT

An improved tailless wire-bonding apparatus for wedge-bonding fine wire used in the manufacture of semiconductor devices including adjustable linear actuating devices, such as solenoids, energized in the proper sequence by a solid state logic circuit, which operate as latching and releasing mechanisms to control the motion of the bonding arm and wire clamp, and a Z-drive to search heights which may be preset and/or adjusted manually with each bond. A viscous hydraulic fluid damping system serves as a velocity limiting device to maintain the bonding arm at a predetermined maximum downward velocity as it drops toward the workpiece, and to eliminate, after impact, all significant vibration between the bonding tool and the fine wire prior to the application of bonding energy. After the termination bond is made and while the bonding tool is still on the fine wire on the workpiece, the wire clamp, grasping the wire in its compliant, non-deforming jaws, moves upward and away from the bond pulling the wire taut until it separates at the heel of the bond leaving no tail. During this maneuver, the bonding tool remains on the bond until the tail has been removed, then lifts and accepts the free end of the wire being fed by the clamp to be ready for the next bonding cycle.

11 Claims, 7 Drawing Figures

VIBRATION-FREE TAILLESS WIRE BONDER

BACKGROUND OF THE INVENTION

1. Field of the Invention

This invention pertains to the general field of metal fusion bonding, and in particular to an ultrasonic wedge bonder which is responsive to timed controls. It utilizes an illuminated optical viewing means, utilizing a compliant cushioning medium to grasp and pull a fine soft wire, and uses high frequency vibratory energy to effect a cold weld. It also has means to juxtapose and bond plural workpieces and is a wire lead bonder.

This invention pertains to an improved tailless wire bonder used in the bonding of semiconductor devices to substrates and utilizes adjustable linear actuating devices energized in sequence by a solid state circuit to operate as latching and release mechanisms to control automatically the Z-motion of the bonding arm while also providing for manual control thereof, a wire clamp with compliant jaws, and a hydraulic damping system to control the velocity of the downward movement of the bonding tool and its subsequent mechanical vibration.

2. Description of the Prior Art

In the manufacture of miniature semiconductor electronic devices, one of the most critical steps, in terms of device reliability, is the formation of the electrical interconnections among the various semiconductor chips and the terminals leading to the external circuits. A standard procedure for accomplishing this interconnection is to attach a fine gold or aluminum wire, on the order of one to five mils in diameter, between the metallized pads on the chip itself and the other terminal to which electrical continuity is required. The wire can be attached by a method called wedge bonding, in which the wire is pressed down against the terminal by a metal wedge which is rapidly vibrated across the bonding surface by an attached ultrasonic transducer, such that the combination of pressure and friction created welds the wire to the terminal without the need for additional heat.

Several factors can produce undesirable results in the wedge-bonding operation. Uncontrolled vibration of the wedge can produce inconsistent pressure against the terminal and result in a bond of insufficient strength; it can also snap the fragile wire. Excessive pressure can thin out the wire to such an extent that a break can occur at the junction between the bonded and unbonded portions of the wire. Excessive pressure also can fracture the glass-like semiconductor material beneath the metallized terminal, leading to an eventual device failure. Deformation of the wire by any handling apparatus before it is fed beneath the wedge can cause variations in the surface contact area between wire and terminal, further reducing the effectiveness of the bond, as well as decreasing the wire's cross-sectional area, making it more susceptible to breakage.

In presently existing wedge-bonding machines, the vertical motion of the wedge onto the workpiece is controlled by an arrangement of motors, belts, gears, levers, cams, microswitches or other electromechanical components. U.S. Pat. No. 3,328,875, U.S. Pat. No. 3,444,612 and U.S. Pat. No. 3,643,321 offer examples of such arrangements. However, such mechanisms may initiate undesirable vibrations in the bonding tool which can continue undamped through the precise instant of welding. If the vibration is in the vertical direction, the wedge can bounce in a jackhammer-like fashion on the wire, producing fluctuations in the bonding pressure.

After the second bond, and therefore after the interconnection has been completed, the remaining wire must be separated from the bond so that subsequent bonds may be made. The separation should be made as close as possible to the bonded area to minimize the size of the tail left protruding therefrom.

U.S. Pat. No. 3,626,590 attempts to solve the tail-removal problem by severing the wire before the second bond is made. A length of wire is fed out from the first bond to a position generally above the site of the second bond, it is cut, and then this loose end must be guided downward by the tool in a somewhat intricate maneuver to the proper bonding position. U.S. Pat. No. 3,643,321 and U.S. Pat. No. 3,863,827 provide for tail removal simply by pulling the wire upward, away from the second bond, until it separates at the heel of the bond. However, this procedure tends to lift the bond upward as well, possibly weakening the adhesion to the underlying terminal. This procedure also may require a system to cause the tool to heel or lean toward the remaining wire to provide a deeper bond deformation at the heel, thus assisting the tail pulling and wire breaking procedure. This requires complex mechanical arrangements and provides sources for unwanted motion during the bond.

SUMMARY OF THE INVENTION

The present invention provides an improved apparatus for producing wedge bonds of fine wires to a metallic or other surface, including an hydraulically controlled damping system to maintain a uniform velocity in the downward travel of the bonding tool to the work surface, vibration-free mechanism for placing the wedge bonding tool onto the workpiece, a method of removing tails without adverse effect to the bond. A compliant, non-deforming clamping device for drawing and feeding the wire, and a system of linear actuators to adjust the upward and downward travel of the bonding tool (its Z-motion) for workpieces involving varying heights. This invention accomplishes these results with mechanisms that are simple to adjust and operate, and have relatively few moving parts, therefore requiring a minimum of maintenance.

The principal components of the bonding apparatus are the wedge bonding tool, the wire clamping device, a clamp motion arm which supports the wire clamping device and moves it in a prescribed manner parallel to the path of the wire, and a main bonding arm assembly which supports both the wedge bonding tool and the wire clamp motion arm. A series of adjustable solenoids or similar linear actuation devices and mechanical stops determine the movement of all the principal components, so no motors, cams or microswitches are used. A solid state logic circuit determines the timing and sequencing of the various solenoids.

In actual operation, the workpiece is mounted onto a work station located generally beneath the wedge, and it is held in place by either a conventional mechanical or vacuum method. A joystick type X-Y positioner permits fine horizontal adjustment of the work station relative to the wedge. Such adjustments may be observed through a microscope mounted to the bonding machine frame. To make the first bond either of two identically functioning control buttons, one on the face of the machine console, one on the X-Y positioner, is pressed and held down. The appropriate solenoids are energized as directed by the logic circuit and the entire bonding arm assembly with the wedge and clamp generally attached, is free to either pivot or fall linearly downward until it hits a preset mechanical stop. This pause at the first search height position allows the exact bonding point on the workpiece to be moved precisely beneath the wedge by means of the X-Y positioner. During this operation, the solenoid-actuated clamping device firmly holds the wire in place directly beneath the wedge. When the workpiece has been positioned properly, the control button is released, and the bonding arm assembly again drops downward until the wire under the wedge contacts the terminal on the workpiece. A counter balance or spring tensioning system can be preset to determine the weight of the bonding arm assembly and therefore determine the force exerted by the wedge on the wire. An hydraulic damping mechanism connected to the bonding arm assembly governs the speed at which it drops. This damping mechanism insures that the bonding arm has the same final velocity at the moment of impact of the wedge with the wire, regardless of the height from which it starts to drop. This guarantees that a uniform impact force is applied to each bond and therefore that an equal amount of wire deformation from impact is achieved each time, both necessary ingredients for consistent bond strengths. This damping mechanism additionally damps any vibration caused by the impact within thirty to seventy milliseconds after contact, so that the relative motion between the wedge and the workpiece terminal is reduced to zero prior to the actual welding procedure.

Next the ultrasonic transducer is energized automatically, the bond is made and, after the ultrasonic vibration has ceased completely the clamping device opens, releasing the wire and the bonding arm assembly moves upward until it again hits a preset mechanical stop. This pause establishes the maximal loop height of the wire above the workpiece.

The bonding sequence is then repeated for the second bond: the control button is pressed, the clamping device gently grasps the wire, the bonding arm assembly moves down to the preset second search height, horizontal adjustments are made to the workpiece, the button is released, contact is made and the bond is effected. However, before the bonding arm assembly again moves upward, there is a slight delay, and a solenoid stop turns off. This permits the clamp motion arm pulled by a spring to pivot slightly back and upward to a predetermined height, drawing back the attached clamping device and the wire held therein away from the second bond, thereby removing the wire tail. All this is done with the wedge still resting upon the completed second bond, to prevent weakening same.

To initiate the final sequence in the bonding cycle, a solenoid is energized, which drives the clamp motion arm back to its original position relative to the bonding arm assembly. Simultaneously the bonding arm assembly resumes its upward travel, lifting the attached wedge clear of the second bond site. The clamping device rigidly attached to the clamp motion arm, also returns to its original position relative to the wedge, and the free end of the wire, protruding from said clamping device, is fed below the wedge, ready for the next bond. The length of this free end tail can be varied by adjusting a mechanical stop which determines the original resting position of the clamp motion arm with respect to the bonding arm assembly, which in turn determines the original resting position of the clamping device with respect to the wedge. Thus the distance between the wedge and the point at which the clamping device engages the wire is varied.

It is intended that the wedge-bonding apparatus of this invention can be operated in an optional mode, in combination with an optical targeting system which shines a spot of light on the exact bonding site on the workpiece. In this mode the control button must be pushed only one time to effect a complete bonding cycle, because the pauses at the first and second search heights are eliminated. The workpiece is maneuvered until the spot illuminates the target, and the button is pressed and held. The bonding arm goes directly down to the workpiece, makes the first bond and then rises to the loop height position. With the control button still held in, the workpiece is adjusted to illuminate the second site. When the button is released, the bonding arm again drops to the workpiece, makes the second bond, removes the tail and returns to the reset position.

The novelty of the present bonder lies in several factors. Adjustable linear actuators are used throughout to control the upward and downward motion of the entire bonding arm assembly, including search heights, loop heights and bonding height. Thus, preset adjustable automatic control for search and bonding heights is provided, the need for continuous use of a Z-motion lever is eliminated. However, a Z-motion lever is provided which is mechanically linked to the linear actuator adjustment means to provide manual control over search heights. Individual adjustments of these linear actuators can adapt the system to varying heights. An hydraulic damping system is utilized to provide a predetermined maximum velocity for the downward motion of the bonding tool to the work surface, regardless of the height from which it is dropped. The damping mechanism further acts as a vibration damper to eliminate quickly all vibration between the bonding tool and the workpiece prior to the application of ultrasonic bonding energy. The wire clamp which positions and pulls the wire is also novel because it has soft jaws which grip and pull the very soft, fine wire without deforming the wire. Furthermore, the resilient lining of the soft jaws enable the soft conductive wire to be grasped without the jaws themselves ever being fully closed. This eliminates deformation of the wire and wear on the jaws. Also it should be noted that the wire is grasped and/or pulled only when all parts of the bonding assembly are in a stable position, that is, none of them are moving. In an alternative embodiment an additional Z-lever type bar may be connected to the adjustable automatic Z-lever controls to permit a manual adjustment of heights for extraordinary circumstances.

It is also intended that the bonding apparatus of this invention be operable with interchangable configurations of wedge bonding tools and clamping mechanisms to permit bonding of gold and aluminum wires and ribbons of various dimensions, and to permit bonding within packages of various geometries and sizes.

DESCRIPTION OF THE PREFERRED EMBODIMENT

Figure 1:
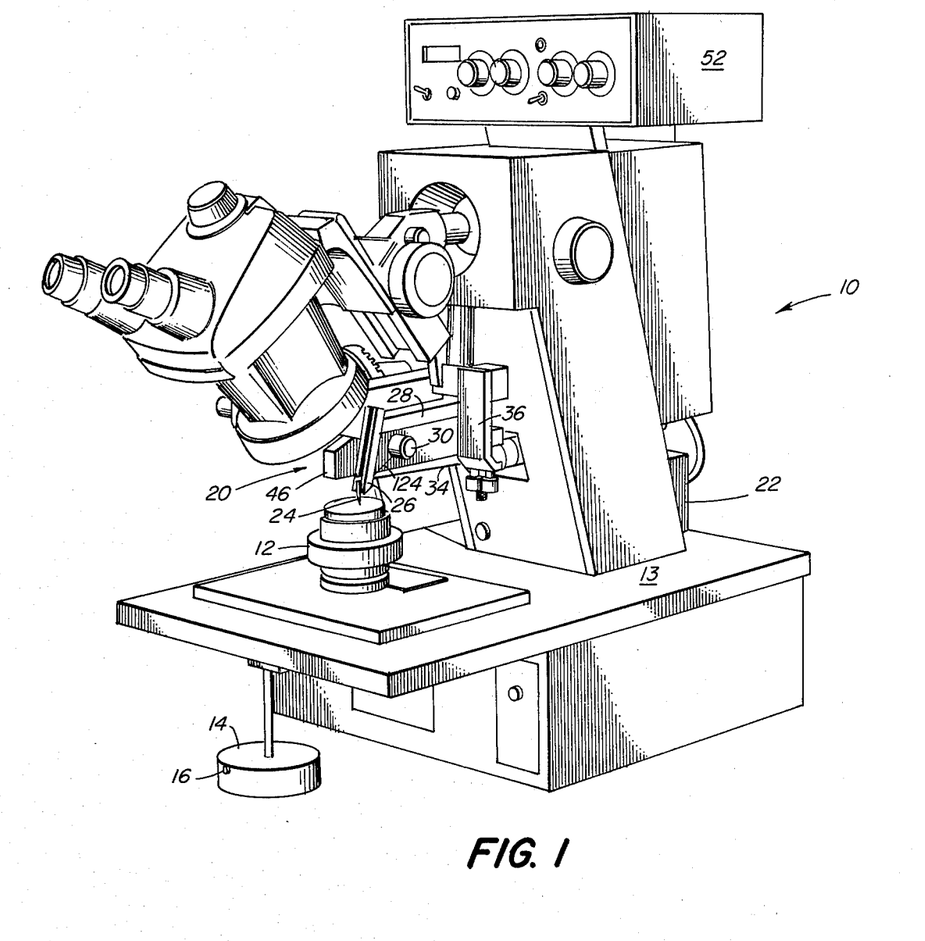
FIG. 1 is a front perspective view of the wedge bonder of this invention.

Referring now to the drawings wherein like reference numbers refer to like components throughout the Figures, FIG. 1 is a side perspective view of the ultrasonic wedge bonder of the present invention, designated generally by the reference numeral 10. Only those elements of wedge bonder 10 which pertain to the novel features or are necessary for an explanation of their use will be pointed out in FIG. 1.

In FIG. 1, there is a work station 12, which can hold by either mechanical or vacuum means the work-piece and a micromanipulator 14 for controlling the X-Y motion of the work-piece. The micromanipulator also has a push-button 16 for activating the bonding cycle of wedge bonder 10. An alternate cycle button 18 may appear on the front panel of the housing, or a foot switch may be substituted.

Figure 2:
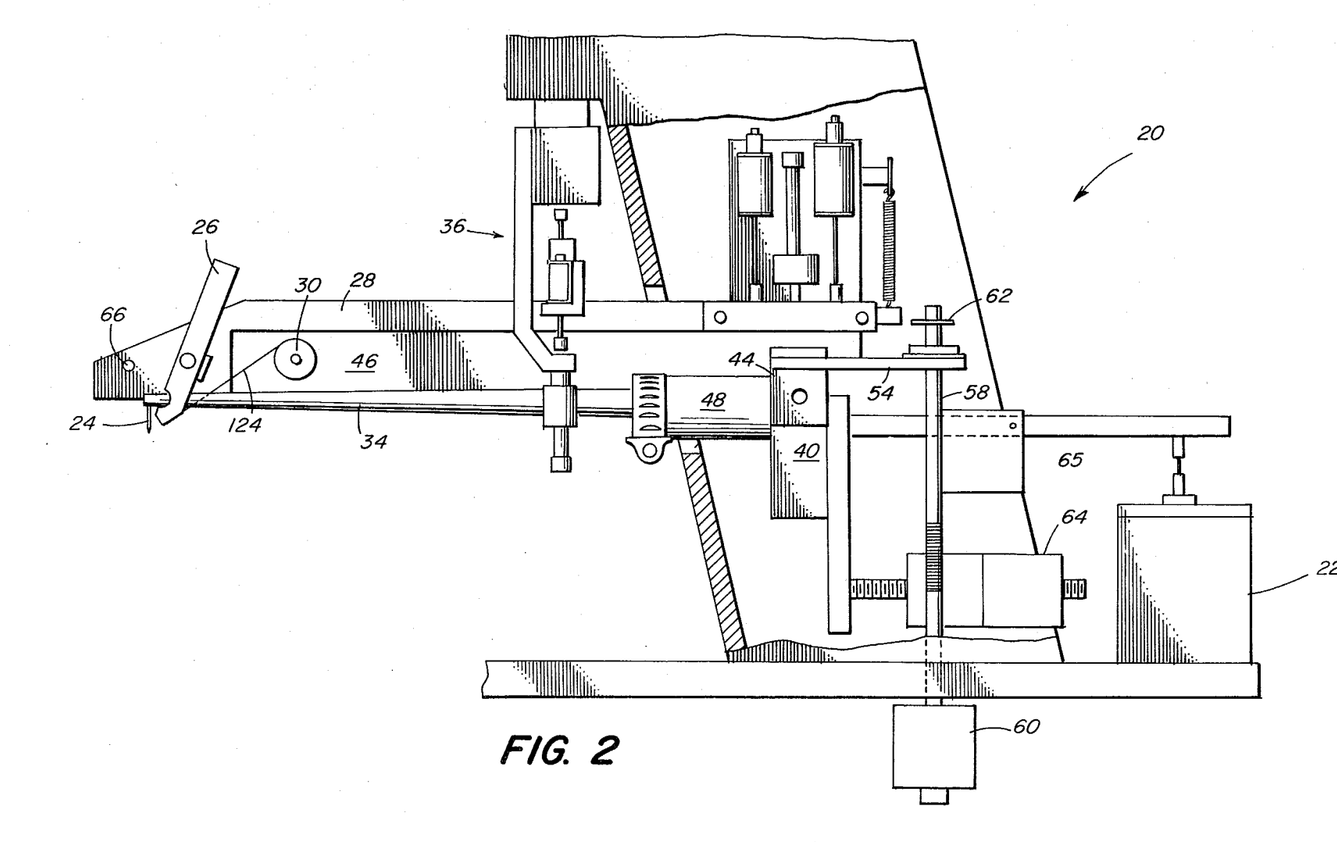
FIG. 2 is a side view, partially cut away, of the entire wedge bonding arm assembly of this invention showing the actuating mechanisms of this system.
Figures 3, 4, 5:
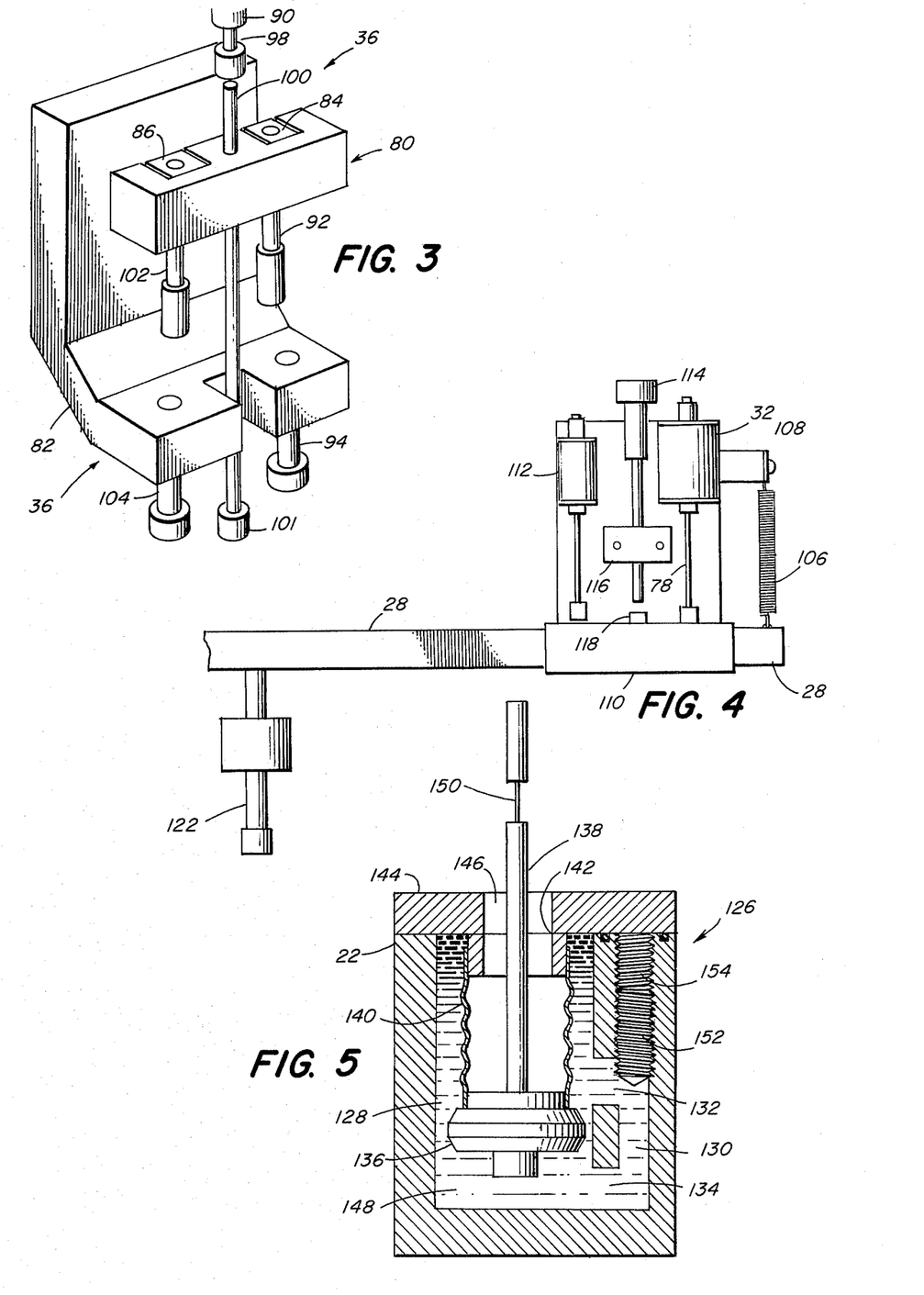
FIG. 3 is a detailed rear view of the actuating and stop mechanism which determines the first and second search heights and the loop height of the bonding arm assembly.
FIG. 4 is a side view of the actuating and stop mechanisms which control the movement of the clamp motion arm during the tail removal operation.
FIG. 5 is a cross-sectional side view of the vibration damping system as connected to the bonding arm assembly.
Figure 7:
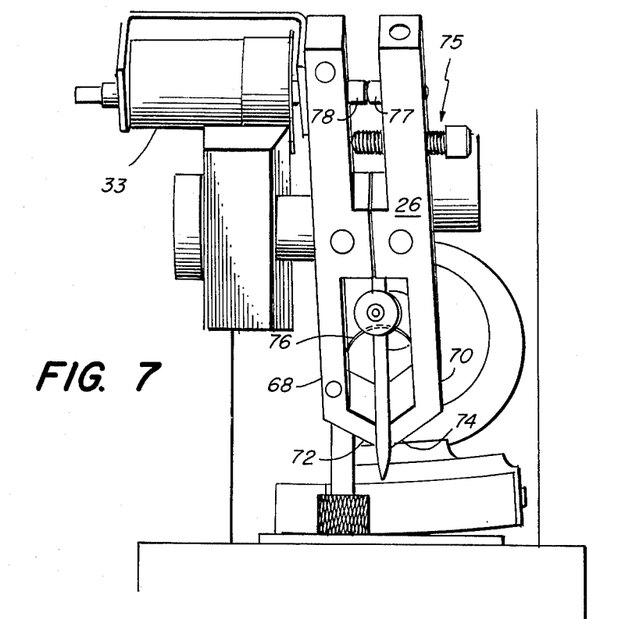
FIG. 7 is a front view of the bonding tool and wire clamp of the present invention.

The principal concern of this invention is with bonding arm assembly 20, which is shown in a perspective view in FIG. 1 and in a more detailed view in FIG. 2. Bonding arm assembly 20 lies in a horizontal plane and extends forward to the work station 12 and rearward through the housing to the damping system housing 22, only a portion of which is visible in FIG. 1. FIG. 1 also illustrates the relative positions of other portions of bonding arm assembly, such as the bonding arm 46, bonding tool 24, wire clamps 26, clamp motion arm 28, wire spool 30, transducer horn 34, and search and loop height adjustment means 36. A tail length adjustment is also on the front of device 10 but for clarity is shown in FIGS. 4 and 7. Detailed descriptions and illustrations of these components will be provided in reference to the subsequent Figures.

FIG. 2 illustrates the bonding arm assembly denoted generally by the reference numeral 20. In the embodiment illustrated in the drawings, the upward and downward motion of bonding arm assembly is caused by a pivotal motion. A pivot block 40 with a cylindrical cavity is pivotally attached to horizontal support arms 44. A bonding arm 46 has one end rigidly attached to one side of pivot block 40. A clamp motion arm 28 is pivotally attached to bonding arm 46. Bonding tool 24, extends vertically downward from transducer horn 34, which extends inwardly along the lower edge of bonding arm 46 to transducer 48 (not visible in FIG. 1) which is mounted within the cylindrical cavity. Bonding arm 46, which also serves as the mounting means for other components hereinafter described is a generally T-shaped plate, attached rigidly at one end to pivot block 40 and extends perpendicularly outward therefrom on a generally horizontal plane. Any one of a series of interchangeable wedge bonding tools 24 can be mounted firmly to transducer horn 34 so as to be generally perpendicular to the work surface. A source of ultrasonic energy for transducer 48 is provided by ultrasonic generator 52 (FIG. 1).

A lever arm 54 is attached rigidly at one end to horizontal support arm 44 and a hole (not shown) at the opposite end of the lever arm accomodates the plunger arm 58 of the Z-drive actuator 60. The Z-drive actuator 60 and the other actuators to be described hereinafter can be electromechanical devices such as solenoids or similarly functioning pneumatic or hydraulic units. Adjustable collar 62 encircles and attaches to actuating plunger 58 and keeps lever arm 54 from being disengaged therefrom. Bonding arm assembly 20 pivots about support arms 44, so that when Z-drive actuator 60 is energized and the plunger arm 58 and its attached collar 62 rise vertically, releasing the restraining force on lever arm 54, the lever arm 54 will rise, and the portion of the bonding arm assembly on the forward side of support arms 44 will drop in a vertical plane until it is stopped by a mechanism hereinafter described. The effective weight of the falling bonding arm assembly 20 can be adjusted by a conventional counterbalance system 64 and sliding weights 65.

Bearing 66 is pivotally mounted through clamp motion arm 28 and is mounted rigidly at one end to bonding arm 46. Referring to FIG. 2 and FIG. 7, wire clamp 26 is mounted firmly on clamp motion arm 28 and is positioned directly behind bonding wedge tool 24. Wire clamp 26 comprises two generally F-shaped clamp arms 68, 70 whose jaws 72, 74 meet at a point slightly behind wedge tool 24. Wire clamp 26 clamps wire from wire spool 30 and directs it through a hole (not shown) in wedge bonding tool 24. A spring 76 maintains wire clamp jaws 72, 74 in normally open position. A set screw 75 can be adjusted to vary the spacing between said jaws 72, 74. A clamp actuator 33 is mounted on clamp motion arm 28 and when activated, and when energized its plunger arm 78 strikes clamp adjust screw 77 on clamp arm 28, closing the jaws 72, 74 of wire clamp 26. Clamp adjust screw 77 can be adjusted to vary the amount of force exerted by jaws 72, 74 when closed.

The inner contacting surfaces of jaws 72, 74 are covered within a thin layer of adhesive-coated splicing tape made from a polyester or polyimide material, the resilience of the tape protecting the soft wire used from serious marking and deformation while being engaged within the jaws. The resilient lining of jaws 72, 74 enables the soft conductive wire to be grasped without the metal jaws 72, 74 ever being closed upon the wire. Also, at all times when the wire is grasped or pulled, all components of bonding arm assembly 20 are in a stable, non-moving position relative to the wire.

Referring now to FIG. 3, the search and loop height adjustment system 36 of wedge bonder 10 are illustrated therein. Wedge bonder 10 is designed for point-to-point stitch bonding without resort to a Z-lever, hence any required interruption of the upward and downward motion of bonding arm assembly 46 must be achieved by other means. This is the purpose of the search and loop height adjustment system 36 which provides for two fixed search heights and at least one loop height, all of which are easily adjustable. Height adjustment system 36 includes a block 80 rigidly attached to the bonding arm 46, perpendicular to its vertical surface. An L-shaped bracket 82 is rigidly attached to the housing of wedge bonder 10. A first search height or solenoid 84 and a second search height or solenoid 86 are secured in block 80 and at least one loop height actuator 90 attached to the housing of the wedge bonder 10 each determine the height of bonding arm 46, and consequently of bonding tool 24 above the workpiece at a particular stage of the bonding operation.

Every bonding cycle begins with bonding arm assembly 20 in its raised position to permit positioning of the workpiece on the work station 12. After the position of the first bond is spotted through the microscope and button 16 is pushed, bonding arm 46 begins to drop so that bonding tool 24 can execute its first bond. At this point first search height actuator 84 is energized, driving its plunger arm 92 to its fully extended position, until it strikes screw 94, causing the downward movement of bonding arm 46 to stop when wedge bonding tool is about two or three mils above the workpiece. Using the X-Y micro-manipulator 14, the operator positions wedge bonding tool 24 over the precise bonding position, and releases pushbutton 16. First search height actuator 84 is deenergized and bonding arm 48 continues its drop to the workpiece. After the first bond is made, which will be explained in detail hereinafter, loop height actuator 90 is energized and bonding arm 46 rises until adjust screw 100 strikes loop height actuator plunger 98, thereby limiting the upward travel of bonding arm 46. When button 16 is pushed again, loop height actuator 90 becomes deenergized, second search height actuator 86 becomes energized, and bonding arm 46 drops until plunger arm 102 of second search actuator 86 strikes an adjust screw 104, thereby stoping the downward drop of bonding arm 46 a few mils above the workpiece for the second search. After the operator locates the precise position of the second bond, button 16 is released, second search height actuator 86 is deenergized, bonding arm 46 drops to make the second bond and returns upward to its normal readiness position against the adjustable up-stop. Screws 94, 100 and 104 are adjustable to vary search heights and loop heights. Upon completion of the bonding cycle, actuators 84, 86 and 96 are deenergized. An alternate means of controlling the Z-motion for search and bonding heights is described in relation to FIG. 6.

FIG. 4 illustrates the actuating mechanism controlling the vertical movement of clamp motion arm 28. A spring 106 is connected between the rear end of clamp motion arm 28 and appendage 108 which protrudes rearward from bonding arm 46. Spring 106 is under light tension and exerts an upward force bias on clamp motion arm 28, but the plunger arm 78 of clamp motion actuator 32, when in its energized state pushes against strike plate 110 which is rigidly attached to clamp motion arm 28, and maintains clamp motion arm 28 in its normal at rest position. At a subsequent time in the bonding cycle, clamp motion actuator 32 becomes deenergized and clamp holdback actuator 112 becomes energized, holding clamp motion arm 28 in a slightly elevated position relative to bonding arm 46. Finally during the bonding wire termination, to be described hereinafter in greater detail, both actuators 32 and 112 becomes deenergized and clamp motion arm 28 rises until clamp pullback adjust screw 114, which is supported by support block 116 rigidly attached to bonding arm 46, strikes contact button 118 on strike plate 110. Clamp pullback adjust screw 114 can be adjusted to alter the highest point of ascent of a clamp motion arm 28. Similarly tail adjust screw 122 defines the lowest point attainable by clamp motion arm 28. A fixed mechanical stop can be substituted for the pull-back adjust screw 114.

Referring back to FIGS. 1 and 2, there is illustrated a bonding tool 24 mounted in transducer horn 34, wire clamp 26 mounted to clamp motion arm 28 and a length of wire 124 fed through clamp 26 and through a guide hole in wedge bonding tool 24. FIGS. 1 and 2 represent the relative positions of the components prior to the start of second bond cycle. At the completion of a second bond, just prior to the termination sequence, wire clamp 26 is in a position intermediate between its lowest and highest positions, its vertical movement being controlled by the vertical movement of clamp motion arm 28. Wire 124 is engaged within the jaws 72, 74 of wire clamp 26 which is in a closed condition. Wedge bonding tool 24 is pressing down upon the completed second bond. Clamp motion arm 28 pivots upward, drawing the attached wire clamp 26, with wire 124 firmly in its grasp back and upward as well, away from the bonding site. In so doing wire clamp 26 breaks the wire from the completed bond eliminating any remnant of a tail. After wire separation (breaking), the transducer horn 34 and wedge bonding tool 24 pivot upward as a unit, lifting bonding tool 24 off the completed bond. Clamp motion arm 28 then drops to its normal at-rest position, and wire clamp 26 return to its bottommost position, its closest point of approach to wedge bonding tool 24, allowing the free end of wire 124 to feed through the guide hole in wedge bonding tool 24, under said tool and protruding a precisely adjustable amount in front of the tool, ready for the next cycle of bonding.

Referring now to FIG. 5 there is depicted a cross-sectional view of the hydraulic damping system, denoted generally by 126 which controls rate of speed at which bonding arm assembly 20 ascends or descends. The damping system 126 is encased in a sealed housing 22. A cylindrical chamber 128 is cut into the interior of the housing 22, with its axis running vertically, and a similarly cut channel 130 runs generally parallel to said chamber 128 and intersects it via two orifices 132, 134 one near the top and one near the bottom. Piston 136, attached to the bottom of rod 138, fits freely into chamber 128 and is able to ride up and down on the inner surface of chamber 128 with no static friction. Diaphragm 140, which is a thin rubber sleeve, is fastened tightly at one end to piston 136 and at the other end to adapter 142 which in turn is attached to access cover 144 of housing 22, thereby forming a friction free, fluidtight seal around rod 138 and between a portion of chamber 128 and access cover 144. The remaining volume of chamber 128 external to sleeve 140 is filled with an hydraulic fluid 148. Rod 138 passes through circular opening 146 in access cover 144 and has a flexible portion 150 which attaches to a rod connected to the end of bonding arm 46. When bonding arm 46 rises, rod 138 likewise rises, pulling piston 136 upward with it. The fit between the outer edge of piston 136 and the inner surface of chamber 128 does not permit much hydraulic fluid 148 to pass, so the majority of the hydraulic fluid 148 is displaced into upper orifice 132, down through channel 130 and via lower orifice 134 into the portion of chamber 128 beneath piston 136. The uniform flow of the fluid through channel 132 insures that the rear of the bonding arm 46 will rise at a constant rate. When the rear of the bonding arm 46 drops, the fluid 148 will flow in the opposite direction through channel 132, this time controlling the rate of descent. The precise speed of flow of fluid 148 through channel 132 is controlled by an adjustment screw 152 acting as a needle valve in a threaded channel 154 accessible when cover 146 is removed. Turning screw 152 downward tends to close channel 132, while turning it upward tends to open said channel 132. Adjustment screw 152 thus provides a very precise means to control the rate of velocity of piston 136.

Hydraulic damping system 126 is connected via piston rod assembly 138 to the rear end of bonding arm assembly 20. The constant, uniform velocity of descent of bonding arm 46 is dampened by adjustable hydraulic damping system 126. Furthermore, upon impact of bonding tool 24 on the workpiece hydraulic damping system 126 will serve to dampen all mechanical vibrations of the impact within thirty to seventy milliseconds. During this short time period, the firing of the ultrasonic energy is delayed.

Figure 6:
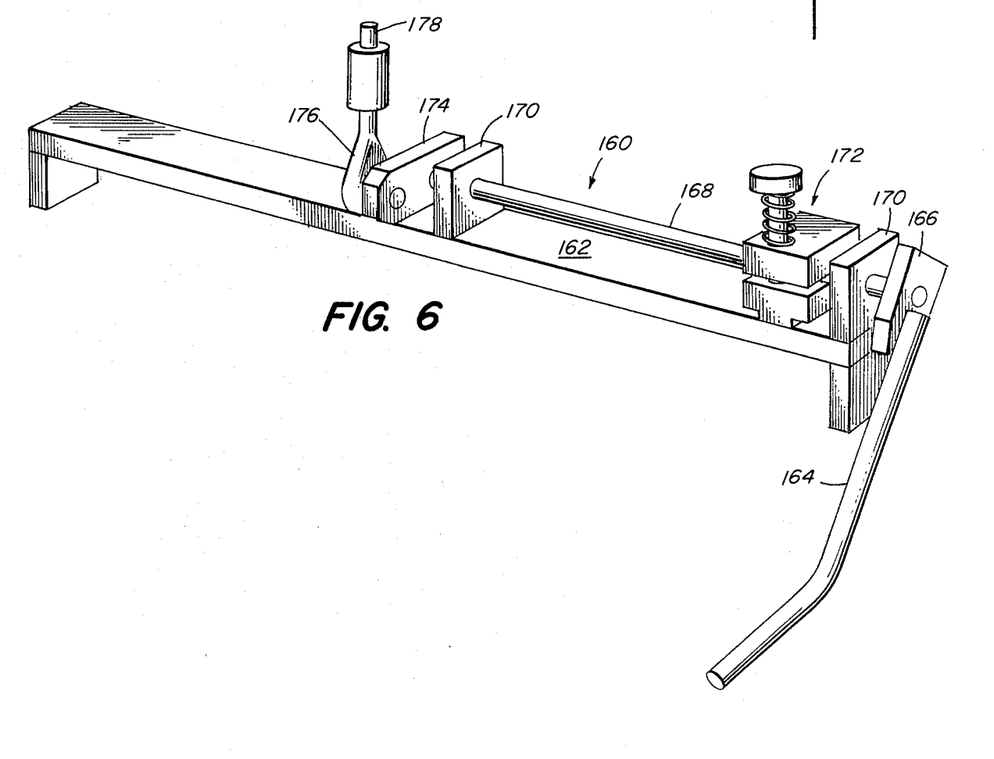
FIG. 6 is a perspective view of an alternate Z-motion arm which may be added to the bonder of the present invention.

Referring now to FIG. 6, an optional Z-motion lever may be provided. Z-motion lever assembly, designated generally by the reference numeral 160, is secured across housing base 13 (FIG. 1) under search and loop height adjustment system 36 by mounting bracket 162. A Z-lever 164 is secured through a bearing 166 to a horizontally oriented rod 168 rotationally mounted on bracket 162 through posts 170. A screw-operated tension adjustment means 172 is provided. Rod 168 terminates at bearing block 174 to which it is securely mounted. A rod end lined bushing 176 is rotatably secured to the forward end of bearing block 174. A rod 178 extends upwardly through bushing 176 and is screwed into bracket 82 in place of screw 94. It acts as an upstop to stay within the range of solenoids 84, 86. To install manual Z-lever system 160, rod 178 is coupled to screw 100 by removing its adjustment knob 101 and screws 94, 104 are adjusted to disable the search height actuators 84, 86. Thus, Z-motion lever system 160 permits the manual adjustment of search and bonding heights when desirable. The Z-lever system 160 can be made to adjust the first search height, the second search height, or both search heights. The proper selection of the shoulder of rod 178 limits the movement within the range of the search solenoids 84, 86. The installation of Z-motion lever assembly 160 is very simple and enables wedge bonder 10 to be used automatically or manually.

It should also be understood that the novel adjustable linear actuators, the optional Z-motion lever assembly, the hydraulic damping assembly and the tailless wire pulling assembly described herein may be incorporated into many types of wire bonders and ball bonders, whether they use thermocompression or ultrasonics as a source of bonding energy. The novelty of the present invention lies in its mechanisms for control of the Z-motion of a bonding tool.

The ultrasonic wedge bonding system 10 of the present invention thus replaces various electromechanical cams, gears, belts and the like with a series of timed linear actuators and a hydraulic damping system to provide a very simple and controllable Z-motion for a bonding tool.

A conventional timing logic circuit is utilized and it is summarized in the following table:

TABLE I

|  | FIRST BOND | | SECOND BOND | |
| --- | --- | --- | --- | --- |
|  | SWITCH HELD IN | SWITCH RELEASED | SWITCH HELD IN | SWITCH RELEASED |
| CLAMP ACTUATOR | ON | OFF | OFF | ON |
| FIRST SEARCH HEIGHT ACTUATOR | ON | OFF | OFF | OFF |
| SECOND SEARCH HEIGHT ACTUATOR | OFF | OFF | ON | OFF |
| LOOP HEIGHT ACTUATOR | OFF | ON | ON | OFF |
| CLAMP MOTION ACTUATOR | ON | OFF | OFF | ON |
| CLAMP HOLDBACK ACTUATOR | OFF | ON | ON | OFF |
| Z-DRIVE ACTUATOR | ON | OFF | ON | OFF |

SUMMARY OF OPERATION

The following is a description of how the various components previously discussed interact during one complete bonding cycle.

Pushbutton switch 16 is pushed and held in initiating the bonding sequence. Clamp motion actuator 32 is energized thereby and firmly grasps wire 124. Z-drive actuator 60 is turned on thereby permitting bonding arm assembly assembly 20 to drop of its own weight, with the maximum downward speed of bonding arm assembly 20 being controlled by hydraulic damping system 126. Clamp motion actuator 32 is energized, to maintain clamp motion arm 28 in its original position relative to bonding arm 46 as defined by tail adjust screw 122. First search height actuator 84 is energized to stop the downward motion of bonding arm assembly 20 before the conductive bonding wire under the wedge bonding tool 24 contacts the workpiece, to permit accurate positioning of the workpiece by the operator. When switch 16 is released, first search height actuator 84 is turned off, allowing bonding arm assembly 20 to continue its descent until bonding tool 24 presses wire 124 against the bonding pad on the workpiece. After a delay of thirty to seventy milliseconds after impact of bonding tool 24 upon the wire on the workpiece, a time delay allowing all perceptible vibration of bonding tool 24 to be damped out, ultrasonic generator 35 is turned on to drive transducer 48, transducer horn 34 and bonding tool 24 and thus effect the first bond. Clamp actuator 33 is turned off, causing wire clamp 26 to open, releasing its grasp on wire 124. Z-drive actuator 60 is then deenergized, causing bonding arm assembly 20 to rise away from the workpiece. First search height actuator 84 remains off, but loop height actuator 90 is turned on, to stop the upward travel of bonding arm assembly 20 and thus to define the maximum height of the wire loop above the workpiece. Simultaneously, the clamp motion actuator 32 is turned off and clamp holdback actuator 112 is on, allowing the clamp motion arm 28 to pivot upward under the action of spring 106 until strike plate 110 hits clamp holdback actuator 112. This rotation of claim motion arm 28 moves wire clamp 26 backward and upward with it, so that the open clamp jaws 72, 74 are opposite a point higher up on wire 124. Next switch 16 is pushed a second time for the second bond and held in as before. Z-drive actuator 60 is energized and bonding arm assembly 20 again drops. This time its downward flight is stopped by the energized second search height actuator 86, again for the purpose of adjusting the X - Y position of the workpiece. When switch 16 is pushed for the second time, clamp actuator 33 is activated, and clamp 26 grasps wire 124. Next switch 16 is released for the second time, second search height actuator 86 is released, bonding arm assembly 20 drops, and the second bond is effected in the same manner as the first bond. Immediately after the second bond has been completed, but while wedge bonding tool 24 remains on the finished bond, clamp holdback actuator 32 is turned off, permitting clamp motion arm 28 to rise, pulled by the action of spring 106, until stopped by clamp pullback adjust screw 114 or preset stop. This movement draws wire clamp 26 even further upward and rearward, separating wire 124 from the completed second bond. After a delay allowing wire separation to take place, the Z-drive actuator 60 is deenergized so that the bonding arm assembly 20 can return to its initial raised position as defined by upstop adjust screw 61. Then clamp motion actuator 112 is energized to push clamp motion arm 28 back to the original position which it occupied at the start of the cycle, which in turn causes wire clamp 26 to return to its original position, thereby feeding the loose end of wire 124 beneath the wedge bonding tool 24.

I claim:

1. An improved apparatus for forming a tailless bond between fine electrically conductive wire and electrical contact points of micro-electronic devices including a housing, means to bond the wire to the work piece and a switching mechanism for initiating and sequencing said bonding cycle, wherein the improvement comprises;

a horizontally extending bonding arm pivotally mounted on said housing and supporting said bonding tool for vertical motion;

an electro-mechanical Z-drive linear actuator extending between said bonding arm and said housing which, when actuated, releases said bonding arm permitting it to lower toward the workpiece under its own weight;

a plurality of electro-mechanical search height actuators, mounted on said bonding arm, each of which can be locked in a fully extended state as directed by the switching mechanism, each engaging a mechanical stop. mounted on said housing impeding the downward travel of said bonding arm, until the position of the underlying workpiece can be adjusted accordingly;

a least one electro-mechanical loop height actuator mounted on the housing above the bonding arm engaging a mechanical stop attached to the bonding arm, arranged so as to strike the fully extended loop height actuator when the bonding arm rises after completion of the first bond of the bonding cycle, thereby defining the maximum loop height of the wire above the workpiece;

a clamp motion arm pivotally attached at one end to said bonding arm and extending along the length thereof;

resilient means mounted to pivot the other end of said arm upwardly;

wire clamp means for gripping the wire mounted on said clamp motion arm;

a pair of clamp motion arm actuators mounted on said bonding arm, each of which in its activated, fully extended state pushes against said clamp motion arm, holding it in one of two fixed positions relative to the bonding arm; and the rearmost one in its deactivated, fully retracted state permitting said clamp motion arm, with the wire clamp means attached, to pivot upward due to the force exerted by said resilient means until stopped by contact with the other activated clamp motion arm actuator, and in so doing, changing the position of the wire clamp means relative to the bonding means tool; the motion occurring when said clamp is open and not gripping the wire;

the other clamp motion arm actuator when also retracted allowing said resilient means to further pivot said clamp motion arm, the further motion occurring with the wire clamp closed and gripping said conductive wire such that said conductive wire is separated from said bond, leaving said bond tailless and a precise length of wire forward of the clamp;

said clamp motion arm actuators being operable to pivot said wire clamp means forward toward said bonding tool to feed a precise length of wire to protrude forward of said bonding tool, thereby providing a precisely controlled tail for the next bond;

means for controlling the rate of the downward descent of said bonding arm to produce a predetermined maximum downward velocity and a uniform, repeatable force exerted by the impact of the bonding tool upon said conductive wire which is in contact with said workpiece regardless of the height from which said bonding arm is released, said means damping the vibratory moting of said bonding arm and said bonding tool after contact of the bonding tool with the workpiece to eliminate detrimental, counteracting forces at the exact moment of bonding.

2. The apparatus of claim 1 wherein the Z-drive actuator, search height actuators, loop height actuators, wire clamp means, and clamp motion arm actuators are hydraulically operated units.

3. The apparatus of claim 1, wherein the Z-drive actuator, search height actuators, loop height actuators, wire clamp means and clamp motion arm actuators are pneumatically operated units.

4. The apparatus of claim 1 wherein said Z-drive actuator, search height actuators, loop height actuators, wire clamp means and clamp motion arm actuators are solenoid operated units.

5. The apparatus of claim 1 in which the mechanical stops associated with the search height actuators, the loop height actuator, and the Z-drive actuator are adjustable over the limited continuous range to permit modification of the positions defined by said stops.

6. The apparatus of claim 5 in which the mechanical stops associated with the search height actuators, loop height actuators, and the Z-drive actuator are adjustable for repeated use by screw adjustment.

7. The apparatus of claim 5 in which the mechanical stops associated with the search height actuators are adjustable for each use by a manual Z-motion arm.

8. The apparatus of claim 7 wherein said Z-motion arm comprises:

a mounting bracket secured to said housing;

a rod mounted horizontally about and parallel to said bracket, and capable of rotational movement;

an L-shaped lever arm;

bearing means securing said L-shaped lever arm to said horizontally mounted rod;

a second rod extending upward to said loop height actuator adjustment screw and secured thereto;

means for electrically selecting first search height, second search height or both search heights.

9. The apparatus of claim 1 wherein the means for controlling the rate of the downward descent and maximum downward velocity of the bonding arm and the means for damping the vibratory motion of the bonding arm comprises;

a housing having an interior vertical cylindrical chamber;

means defining a slender channel, internal to the housing but external to said cylindrical chamber, which connects the upper and lower extremities of said chamber through upper and lower orifices;

a flexible sleeve within said cylindrical chamber;

a circular piston which tightly engages the inner surface of said flexible sleeve, but is free to move vertically along the length of the chamber;

a connecting rod flexibly attached at one end to said piston and at the other end to said bonding arm which causes said piston to rise or fall in accordance with the movements of said bonding arm, and which transmits the vibratory motion of said bonding arm to said piston;

a viscous incompressible hydraulic fluid which fills the cylindrical chamber and which by being displaced at a uniform rate through the upper and lower orifices to the slender channel from one end of the chamber to the other by the moving piston, slows down and regulates the vertical movement of said piston and consequently said bonding arm, and which due to its viscosity damps out the vibratory motion of the piston produced by said bonding arm;

means for adjusting the cross-sectional area of said upper orifice to adjust the rate of flow of the fluid into said channel;

a seal for confining said fluid to the volume of the cyclindrical chamber;

an access cover to tightly enclose the interior of the housing, with an opening to permit the exit of said connecting rod;

said apparatus being a static friction-free dash pot providing impact control by governing the maximum downward velocity of the bonding tool; and said apparatus acting as a vibration damper to eliminate quickly all vibration between the bonding tool and the workpiece prior to the application of bonding energy.

10. The apparatus of claim 1 further including adjustable means for varying and controlling the closest point of approach of said wire clamp to means to said wire bonding means, thereby varying the length of said conductive wire fed into under and protruding forward of said wire bonding means, prior to the first bond.

11. The apparatus of claim 1, further including adjustable screw means for varying the predetermined height of said bonding arm above said contact point.

* * * * *